(12) United States Patent  
Lahav et al.

(10) Patent No.: US 7,773,138 B2
(45) Date of Patent: Aug. 10, 2010

(54) COLOR PATTERN AND PIXEL LEVEL BINNING FOR APS IMAGE SENSOR USING 2×2 PHOTODIODE SHARING SCHEME

(75) Inventors: Assaf Lahav, Migdal Haemek (IL); David Cohen, Migdal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 336 days.

(21) Appl. No.: 11/854,501

(22) Filed: Sep. 12, 2007

(65) Prior Publication Data

US 2008/0062290 A1 Mar. 13, 2008

Related U.S. Application Data

(60) Provisional application No. 60/825,565, filed on Sep. 13, 2006.

(51) Int. Cl.
*H04N 5/335* (2006.01)
(52) U.S. Cl. .................................. 348/280; 348/281
(58) Field of Classification Search ................ 348/273, 348/275, 276, 277, 280, 281
See application file for complete search history.

(56) References Cited

U.S. PATENT DOCUMENTS

| 3,971,065 | A | 7/1976 | Bayer | |
|---|---|---|---|---|
| 6,160,281 | A | 12/2000 | Guidash | |
| 6,346,969 | B1* | 2/2002 | Kwon | 348/273 |
| 6,657,665 | B1 | 12/2003 | Guidash | |
| 6,992,714 | B1* | 1/2006 | Hashimoto et al. | 348/273 |
| 7,479,998 | B2* | 1/2009 | Mitsunaga et al. | 348/273 |
| 2004/0109068 | A1* | 6/2004 | Mitsunaga et al. | 348/222.1 |
| 2005/0012836 | A1* | 1/2005 | Guidash | 348/302 |
| 2005/0110884 | A1* | 5/2005 | Altice et al. | 348/302 |
| 2006/0017829 | A1* | 1/2006 | Gallagher | 348/276 |
| 2006/0027843 | A1* | 2/2006 | Ogura et al. | 257/291 |
| 2006/0044434 | A1* | 3/2006 | Okita et al. | 348/294 |
| 2006/0044439 | A1* | 3/2006 | Hiyama et al. | 348/308 |

(Continued)

OTHER PUBLICATIONS

Chu et al. "Improving low-light CMOS performance with four-transistor four-shared pixel architecture and charge-domain binning", Proc. of SPIE-IS&T Electronic Imaging, SPIE vol. 6069, 606903, 2006, 9 pages.

(Continued)

*Primary Examiner*—Jason Chan
*Assistant Examiner*—Nicholas G Giles
(74) *Attorney, Agent, or Firm*—Bever, Hoffman & Harms, LLP; Patrick T. Bever

(57) ABSTRACT

A color image sensor includes an array of pixels arranged in a plurality of pixel groups, each pixel group including a floating diffusion that is shared by four pixels disposed in a 2×2 arrangement. Each of said four pixels includes a photodetector and a color filter superposed over the photodetector, wherein a first pair of said four pixels include green color, and a second pair of said four pixels includes either red or blue color filters. A control circuit controls the pixel groups such that discrete image information is generated from each pixel in normal light situations, and such that summed image information is generated from each pixel group in low light situations by simultaneously connecting the green pixels to the floating diffusion during a first time period, and simultaneously connecting the red/blue pixels to said floating diffusion during a second time period.

18 Claims, 12 Drawing Sheets

U.S. PATENT DOCUMENTS

2009/0219421 A1* 9/2009 Altice et al. ............... 348/296

OTHER PUBLICATIONS

Kim et al. "½-inch 7.2MPixel CMOS Image Sensor with 2.25μm Pixels Using 4-Shared Pixel Structure for Pixel-Level Summation", 2006 IEEE International Solid-State Circuits Conference, Digest of Technical Papers, Feb. 8, 2006, pp. 494-495, 669.

Mori et al. "¼-Inch 2-Mpixel MOS Image Sensor With 1.75 Transistors/Pixel", IEEE Journal of Solid-State Circuits, vol. 39, No. 12, Dec. 2004, pp. 2426-2430.

* cited by examiner

COLOR PATTERN AND PIXEL LEVEL BINNING FOR APS IMAGE SENSOR USING 2×2 PHOTODIODE SHARING SCHEME

RELATED APPLICATION

This application claims priority of U.S. Provisional Patent Application 60/825,565, entitled "Color Pattern For Pixel Level Binning In A 2×2 Diode Sharing" filed Sep. 13, 2006.

FIELD OF THE INVENTION

This invention relates to solid state image sensors, and more specifically to high resolution (i.e., small pixel size) color image sensors that utilize 2×2 photodiode sharing schemes.

BACKGROUND OF THE INVENTION

Solid-state image sensors are used in, for example, video cameras, and are presently realized in a number of forms including charge coupled devices (CCDs) and CMOS image sensors. These image sensors are based on a two dimensional array of pixels. Each pixel includes a sensing element that is capable of converting a portion of an optical image into an electronic signal. These electronic signals are then used to regenerate the optical image on, for example, a liquid crystal display (LCD).

Although CMOS image sensors first appeared in 1967, CCDs dominated the image sensing market after their invention in 1970. Both solid-state imaging sensors depend on the conversion of light photons into electron hole pairs in the silicon substrate when they are exposed to light. The number of electrons holes pair which are released is proportional to the number of photons or light intensity and has dependency on the light wave-length. Even though both technologies use the same physical properties, all-analog CCDs dominated vision applications because of their superior dynamic range, low fixed-pattern noise (FPN), and high sensitivity to light.

More recently, however, CMOS image sensors have gained in popularity. Pure CMOS image sensors have benefited from advances in CMOS technology for microprocessors and ASICs and provide several advantages over CCD imagers. Shrinking lithography, coupled with advanced signal-processing algorithms, sets the stage for sensor array, array control, and image processing on one chip produced using these well-established CMOS techniques. Shrinking lithography should also decrease image-array cost due to smaller pixels. However, pixels cannot shrink too much, or they have an insufficient light-sensitive area. Nonetheless, shrinking lithography provides reduced metal-line widths that connect transistors and buses in the array.

CMOS pixel arrays are at the heart of the newly developed CMOS image sensors. CMOS pixel-array construction uses active or passive pixels. Active-pixel sensors (APSs) include amplification circuitry in each pixel. Passive pixels use photodiodes to collect the photocharge, whereas active pixels can include either photodiode or photogate light sensitive regions. The first image-sensor devices used in the 1960s were passive pixel arrays, but read noise for passive pixels has been found to be high, and it is difficult to increase the passive pixel array's size without exacerbating the noise. CMOS active-pixel sensors (APSs) overcome passive-pixel deficiencies by including active circuits (transistors) in each pixel.

FIG. 14 shows a CMOS APS image sensor circuit 50 that includes a pixel array 60 and control circuitry 70.

Pixel array 60 includes a closely spaced matrix of APS cells (pixels) 90 that are arranged in rows and columns. Pixel array 60 is depicted as a ten-by-ten array for illustrative purposes only. Pixel arrays typically consist of a much larger number of pixels. Each APS cell 90 of pixel array 60 includes a light-sensing element that is capable of converting a detected quantity of light into a corresponding electrical signal at an output terminal 95. The pixels in each row are connected to a common reset control line 73 and a common row select control line 77. The pixels in each column are connected through respective output terminals 95 to an associated common column data line 80.

Control circuitry 70 includes a row decoder 73 and sense amplifiers/registers 77. A timing controller (not shown) provides timing signals to row decoder 70 that sequentially activates each row of APS cells 90 via reset control lines 74 and row select control lines 75 to detect light intensity and to generate corresponding output voltage signals during each frame interval. The timing of the imaging system is controlled to achieve a desired frame rate, such as 30 frames per second in video applications. The detailed circuitry of the row decoder 73, sense amplifiers/registers 77 and timing controller is well known to one ordinarily skilled in the art.

During operation, APS cells 90 are utilized to detect an image. When detecting a particular frame, each row of APS cells 90 may be activated to detect light intensity over a substantial portion of the frame interval. In the time remaining after the row of APS cells 90 has detected the light intensity for the frame, each of the respective pixels simultaneously generates output voltage signals corresponding to the amount of light detected by that APS cell 90. If an image is focused on the array 60 by, for example, a conventional camera lens, then each APS cell 90 generates an output voltage signal corresponding to the light intensity for a portion of the image focused on that APS cell 90. The output voltage signals generated by the activated row are simultaneously provided to column output lines 80 via output terminals 95. Column output lines 80 transmit these output voltage signals to sense amplifiers/registers 77.

In order to reduce cost of digital cameras having more than 1 million pixels, the pixel size of CMOS image sensors is constantly decreasing. The signal-to-noise ratio (SNR) in low light of such small pixel is limited on the one hand by the smaller amount of photons impinging the pixel due to it's size, and on the other hand by (almost) constant system noise due to noise cancellation in pixel level (for modern 4T APS pixel).

When pixel dimension is decreased it is sometimes desirable to share the functionality of several transistors in the pixel in order to increase optical area. FIG. 15 depicts an exemplary approach to sharing the functionality of several pixels in which a pixel group PG includes four pixels P1 to P4 from two adjacent columns and rows that share a floating diffusion FD, a source follower transistor SF, a RESET transistor RST, and a SELECT transistor SEL. Pixels P1 to P4 respectively include photodiodes D1 to D4 and transfer gate transistors TG1 to TG4 that are collectively connected to floating diffusion FD. Floating diffusion FD is connected to source follower transistor SF and shared RESET transistor RST, also common to all the pixels is the SELECT transistor SEL. The operation of pixel group PG is described, for example, in U.S. Pat. No. 6,160,281 and U.S. Pat. No. 6,657,665, both patents being incorporated herein by reference in their entirety. As set forth in those patents, the sharing arrangement shown in FIG. 15 may be extended to share up to sixteen pixels. This sharing arrangement has many advantages over other sharing schemes, and it is widely used (see, for example, Matsushita paper: M. Mitsuyoshi et. al, IEEE Jour. Of Solid State Circuits, Vol39, p2426, 2004). The main advantage of this sharing arrangement is the ability to reduce the stray capacitance of the FD, and as a result get better process control, and with clever pixel design it can significantly reduce compare to other pixel sharing schemes.

The sharing of a floating gate between several pixels opens the possibility of sharing the charge collected from two or more pixels. This is most important when illumination conditions are poor or when pixel size is decreasing below 3.0 μm. In those conditions, the charge collected in the diode is typically low compared to the pixel or system noise. In this case, and assuming that the transfer from photodiode PD to floating diffusion FD does not add additional noise, one can open two or more transfer gates TG that are connected to the same floating diffusion FD, and thus combine (sum) the charge collected in two or more diodes. Because this charge summing ("binning") process is executed before the pixel or system amplifier, the binning process inherently increases the resulted SNR. However, there are several problems concerning this solution: the first problem is that binning produces lower resolution from the sensor simply because every two or more photo sites are read as one. The second is the special algorithm needed in order to retain color information.

Color image sensors include color filters that are superposed over the sensor's photodetectors in a one-to-one relationship (i.e., such that each photodetector receives light filtered by a single-colored filter). The color filters are typically formed as a color filter "mosaic" in which filters having three different colors are arranged in a predetermined pattern. Most color image sensors use red, green, and blue filters that are arranged in a so-called Bayer Pattern, which is disclosed, for example, in U.S. Pat. No. 3,971,065. The Bayer pattern is schematically presented for a four row, five column array in FIG. 16. Note that each row (e.g., the top row including pixels/filters G1, B2, G3, B4 and G5) includes green filters in every other position, and only one of blue and red filters in each row (e.g., the first row includes only blue filters, and the second row (R6, G7, R8, G9, R10) includes only red filters). Note also that the green filters are aligned to form diagonal lines DLA and DLB in both left-to-right and right-to-left directions, but the red and blue filters are disposed in every other position along diagonal lines DLC and DLD.

The color information in a (one chip) CMOS image sensor is retained in a process called demosaicing. With image sensors using the Bayer Pattern, the simplest demosaicing algorithm uses four adjacent pixels in order to determine the RGB values of each pixel. For a given pixel having a green filter, the green value for that pixel is determined by the signal of the pixel itself, and blue and red values are estimated from the signals generated in adjacent blue/red pixels. For example, the RGB values for the pixel/filter G7 (which includes a green filter) are: green value (signal from pixel/filter G7), red value (signal from pixel/filter R8), and blue value (signal from pixel/filter B9). For the blue or red pixel sites, average values of the nearest green pixel/filter are used. For example, the RGB values for pixel/filter R8 are: green value (signal from pixel/filters G7 and G14 divided by two), red value (signal from pixel/filter R8), and blue value (signal from pixel/filter B12). Similarly, the RGB values for pixel/filter B12 are: green value (signal from pixel/filters G7 and G13 divided by two), red value (signal from pixel/filter R8), and blue value (signal from pixel/filter B12). Other more sophisticated algorithms for demosaicing are known to those skilled in the art.

As used herein, the term "binning" refers to the summing of image information charges generated by two or more pixels in poor illumination (e.g., low light) conditions prior to sensing the charge level. When pixel level charge binning is performed it is not desirable to add data from pixels with different colors because of the loss of chromatic information. For example, combining the charge from a green pixel and the charge from a red pixel provides substantially useless information. In addition, not all color filter information is generated equally—in a poor illumination (low light) conditions, pixels that are covered with green filters typically collect orders of magnitude more charge than pixels covered with blue filters. Therefore, the charge binning process is more important for the blue pixels than from green pixels, especially in low light conditions.

FIG. 17 is a simplified diagram depicting a pixel group PGA of a conventional color image sensor that combines the 2×2 sharing scheme (described above with reference to FIG. 16) with a color filter mosaic having the conventional Bayer pattern. Pixel group PGA is representative of all pixel groups of the color image sensor. As indicated in FIG. 17, pixel group PGA includes two green pixels (P1A and P4A), one blue pixel (P2A) and one red pixel (P3A). This facilitates convenient binning of the two green signals in each pixel group, but the red and blue signals will have to be read without binning. This is the fundamental reasons why it is not beneficial to implement pixel level charge binning in a 2×2 pixel arrangement with conventional Bayer Pattern filter arrangement.

Recently, Samsung (Young Chan Kim et al; ISSC2006, p494, 2006) and Kodak (F. Chu et al, Kodak; Proc if SPIE, Vol 6065, p606903, 2006) reported pixel level charge binning in a 4×1 sharing scheme. The advantage of the 4×1 sharing scheme is that it facilitates binning two green pixels and two red or blue pixels. The main drawback of these 4×1 binning schemes compared to the 2×2 arrangement is that in most cases the resulted FD is considerably higher than in the 2×2 arrangement due too long metal lines which are needed to connect the four separated drains of the individual TG. This reduces significantly the pixel sensitivity, which is one of the most important parameters for small (<4 um) pixels.

What is needed is a CMOS image sensor that combines the highly space-efficient 2×2 pixel sharing arrangement with charge sharing on a pixel level between two green pixels and two red or blue pixels.

SUMMARY OF THE INVENTION

The present invention is directed to a color image sensor that utilizes a new color filter configuration and a 2×2 pixel-sharing arrangement to facilitate charge sharing on a pixel level between two green pixels two red or blue pixels. The present invention is also directed to algorithms for image demosaicing using the new color filter configuration that include appropriate timing schemes for charge binning at the pixel level.

In a disclosed embodiment of the present invention the present invention, a CMOS image sensor includes an array of photodetectors arranged in rows and columns, and a novel color filter mosaic including individual filter elements that are superposed in one-to-one registry over the photodetectors. Similar to the conventional Bayer Pattern, the filter elements are arranged in repeating patterns such that a green filter is present over every other said photodetector in each row and column, and offset such that the green filters form diagonal lines. However, unlike the Bayer Pattern, the red and blue filters disposed over every fourth photodetector in each row and column, and offset such that the red and blue filters form diagonal lines in one direction that include only red/blue filters (in a diagonal direction perpendicular to the red/blue diagonal lines, the red and blue filters are positioned in every other filter location).

In accordance with another aspect of the present invention, the array of photodetectors disposed under the novel color filter mosaic is arranged in the 2×2 sharing scheme such that each 2×2 pixel group includes two green pixels and two other pixels that are either red or blue. Specifically, there are two types of pixel groups, a first pixel group type including two green pixels and two blue pixels, and a second pixel group type including two green pixels and two red pixels. With this arrangement, pixel level binning is achieved for green, red and blue pixels without losing color information. That is, green pixel level binning is achieved in either the first pixel group type or the second pixel group type by summing the two green pixels, blue pixel level binning is achieved in the first pixel group type by summing the two blue pixels, and red pixel level binning is achieved in the second pixel group type by summing the two red pixels. Accordingly, the present invention facilitates highly reliable pixel level for green, blue and red pixels without losing color information.

In accordance with a third aspect of the present invention, a color image sensor includes a novel control circuit in conjunction with the 2×2 sharing scheme and novel filter pattern to selectively produce full resolution RGB image information (i.e., RGB values for each pixel position), or lower resolution RGB image information that utilizes the analog signal sharing process of the present invention to produce RGB image information for each 2×2 pixel group with inherently increased SNR. In one embodiment, the analog signal sharing process is used to produce medium (e.g., ¼) resolution image information in which each pixel group is treated as a single, lower resolution pixel. Although the image information is lower resolution, the binning process avoids problems associated with signal noise in low light situations. In another embodiment, low (1/16) resolution is achieved to combining RGB information for four adjacent 2×2 pixel groups.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in color image sensors. The following description is presented to enable one of ordinary skill in the art to make and use the invention as provided in the context of a particular application and its requirements. As used herein, directional terms such as "above" and "below" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
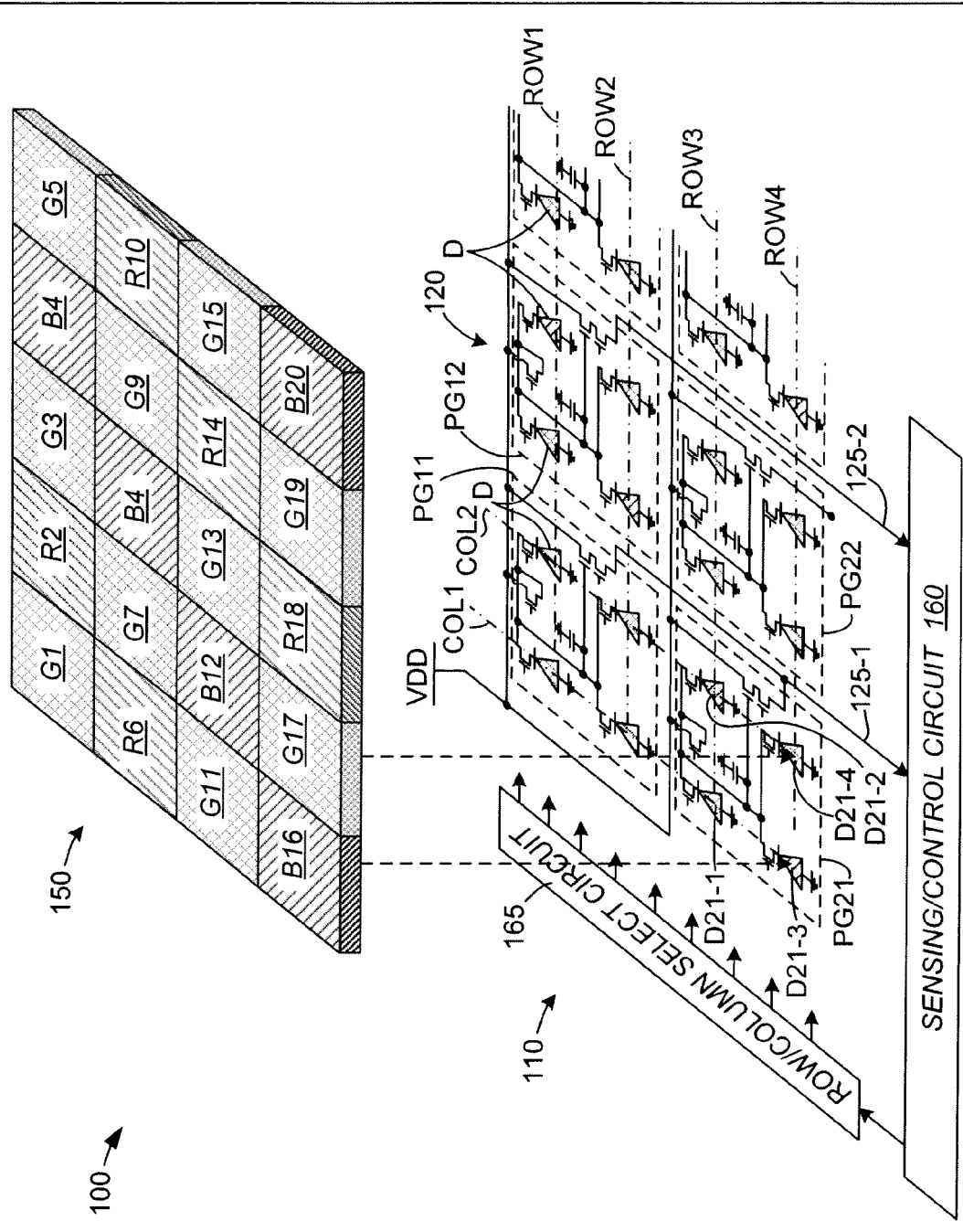
FIG. 1 is a top side perspective view showing a color image sensor according to an embodiment of the present invention.

FIG. 1 is an exploded perspective view showing a simplified color image sensor 100 according to an embodiment of the present invention. Image sensor 100 includes a complementary metal-oxide-silicon (CMOS) sensor circuit 110 and a color filter mosaic 150 including individual filter elements (e.g., G1, R2, etc.) that are superposed in one-to-one registry over photodetectors D. Similar to conventional CMOS image sensors, sensor circuit 110 includes a photodiode array 120, a sensing/control circuit 160, and a select circuit 165 that is controlled by sensing/control circuit 160 to access photodiode array 120 in the manner described below.

Figure 15:
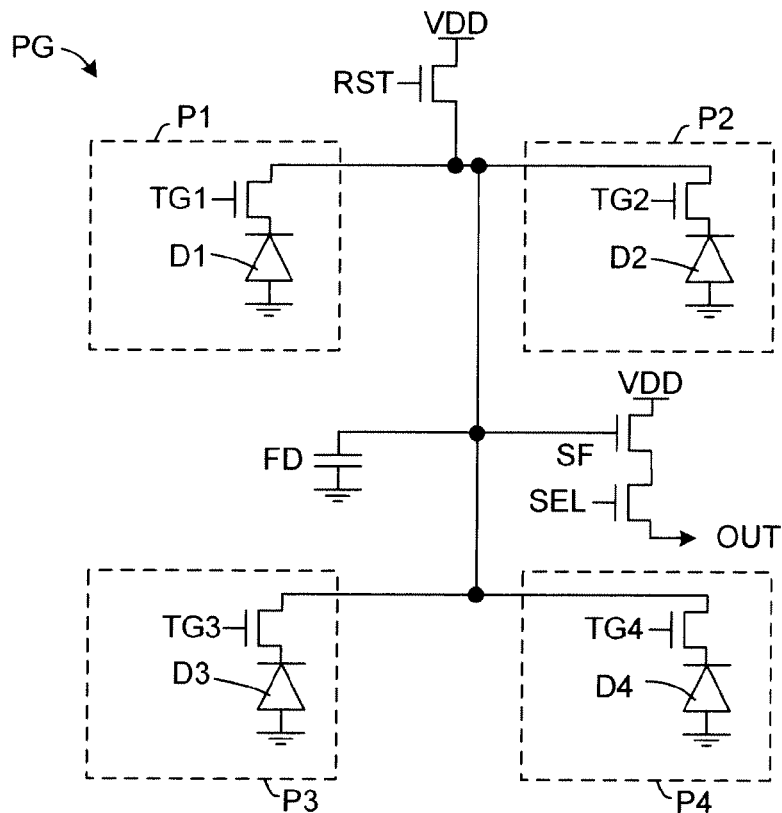
FIG. 15 is a circuit diagram depicting a conventional 2×2 pixel group.

As indicated in FIG. 1, array 120 includes photodiode (photodetectors) Dx arranged in rows and columns, with adjacent photodiodes being connected in the shared arrangement described above with reference to FIG. 15, thereby forming two-by-two (2×2) pixel groups PG11, PG12, PG21 and PG22. Each pixel group includes four pixels arranged in two adjacent rows and two adjacent columns. For example, pixel group PG21 includes photodiodes D21-1, D21-2, D21-3 and D21-4. Photodiodes D21-1 and D21-2 are in array row ROW3, and photodiodes D21-3 and D21-4 are in array row ROW4. Photodiodes D21-1 and D21-3 are in array column COL1, and photodiodes D21-2 and D21-4 are in array column COL2. Each pixel group is connected to sensing/ control circuit 160 by way of a signal line that is shared with other pixel groups in the same column. For example, pixel groups PG11 and PG21 are connected to sensing/control circuit 160 by way of signal line 125-1, and pixel groups PG12 and PG22 are connected to sensing/control circuit 160 by way of signal line 125-2. Additional detail regarding the 2×2 pixel groups is provided below.

Figure 2:
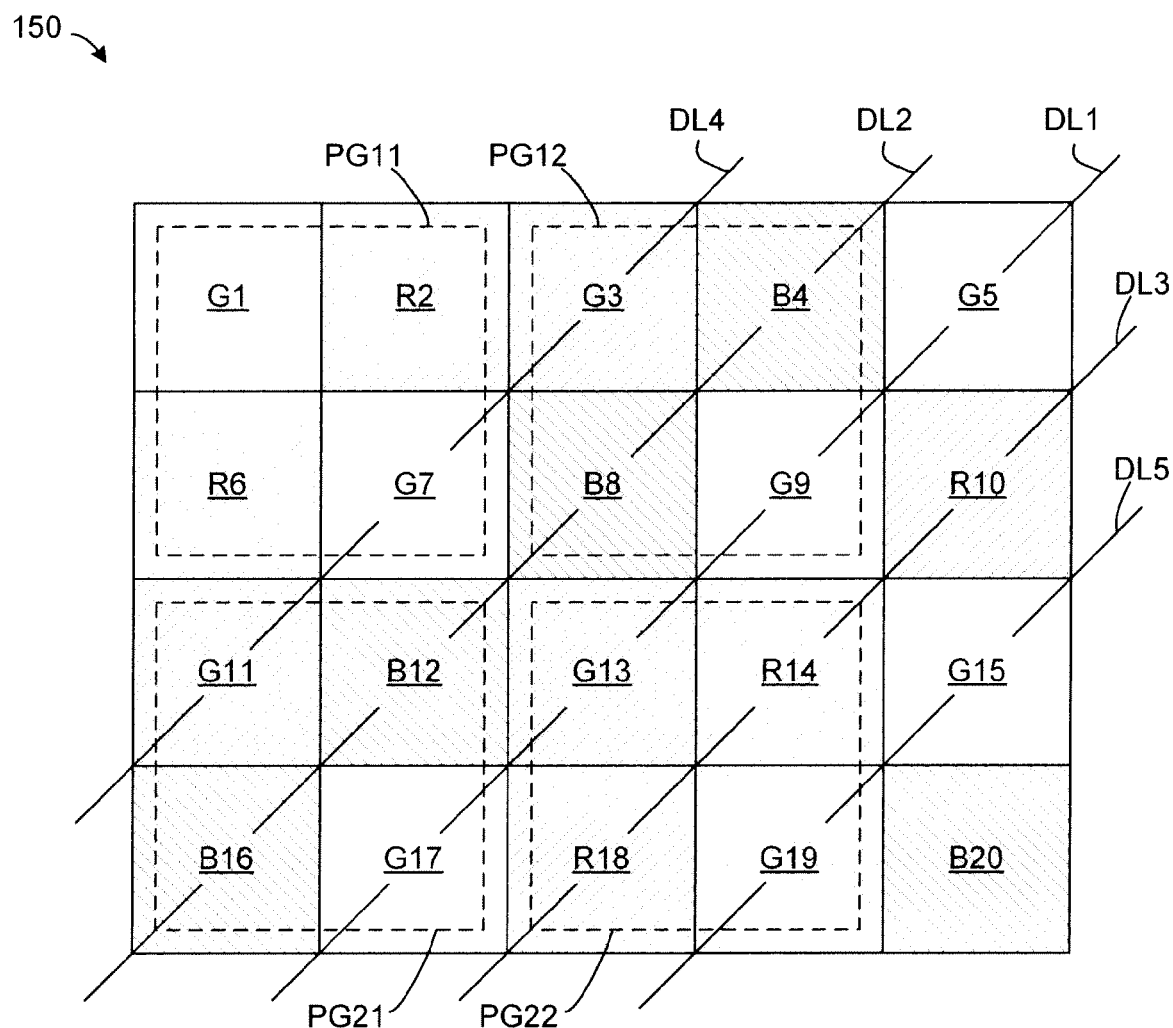
FIG. 2 is a plan view showing a color filter mosaic utilized in the image sensor of FIG. 1.

As indicated in FIGS. 1 and 2, color filter mosaic 150 includes three types of color filters, each having a unique luminance transparency characteristic. In the disclosed embodiment, the first type of filter element is green (indicated by "Gx", where "x" indicates pixel position), the second type of color filter is blue (indicated by "Bx", where "x" indicates pixel position), and the third type of color filter is red (indicated by "Rx", where "x" indicates pixel position). Those skilled in the art will recognize that other filter colors may be used in place of green, blue and red.

Figure 16:
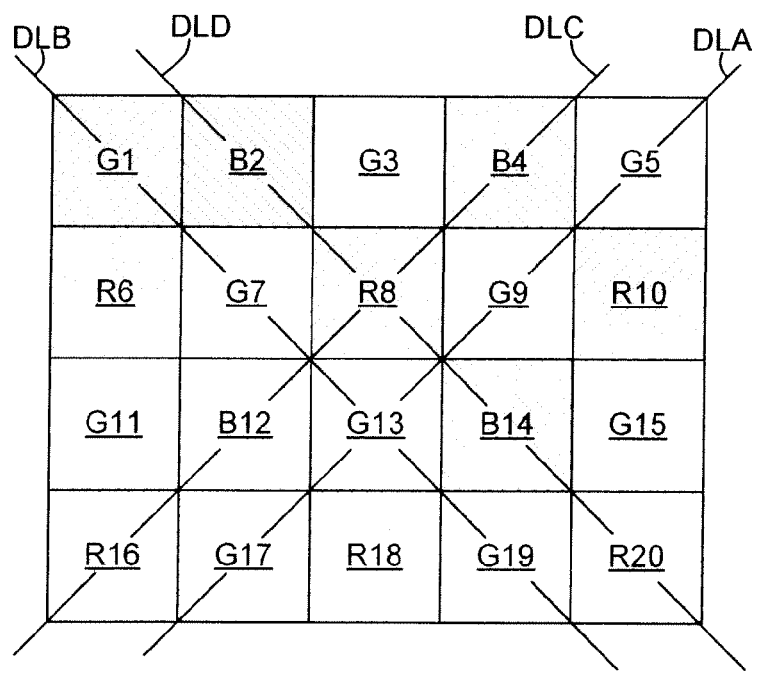
FIG. 16 is a plan view showing a conventional color filter mosaic.
Figure 17:
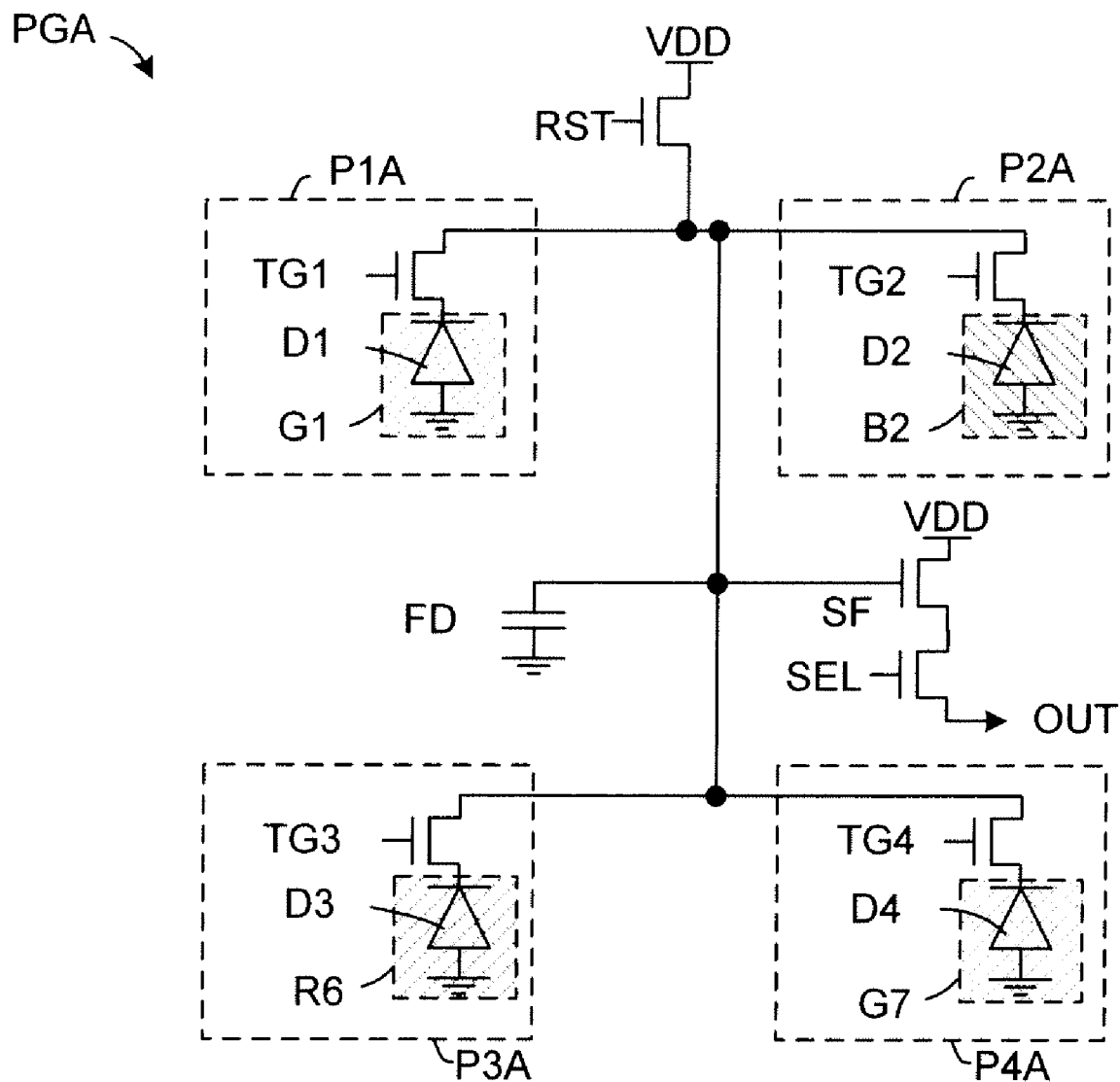
FIG. 17 is a circuit diagram depicting a conventional color imaging sensor using the 2×2 pixel groups of FIG. 15 and the conventional color filter mosaic of FIG. 16.

In accordance with an aspect of the present invention, the color filters of color filter mosaic 120 are arranged in a novel repeating patterns that facilitates the signal binning approach described below. A characteristic of this novel color filter pattern is that, unlike the Bayer Pattern (described above with reference to FIG. 16), color filters of each type (red, green and blue) appear in each row of mosaic 150, and are offset and aligned to form diagonal lines that include only one type of color filter. For example, as indicated in FIG. 2, green color filters G5, G9, G13 and G17 of mosaic 150 form a diagonal line DL1. Similarly, blue color filters B4, B8, B12 and B16 of mosaic 150 form a diagonal line DL2, and red color filters R10, R14 and R18 of mosaic 150 form a diagonal line DL3. Note that green filters are disposed along every other diagonal line such that (green) diagonal line DL1 is disposed between (blue) diagonal line DL2 and (red) diagonal line DL3, (blue) diagonal line DL2 is disposed between (green) diagonal lines DL1 and DL4 (which is made up of green filters G3, G7 and G11), and (red) diagonal line DL3 is disposed between diagonal line DL1 and (green) diagonal line DL5 (which is made up of green filters G15 and G19. The benefit of this novel color filter pattern will become apparent below.

Figure 3A:
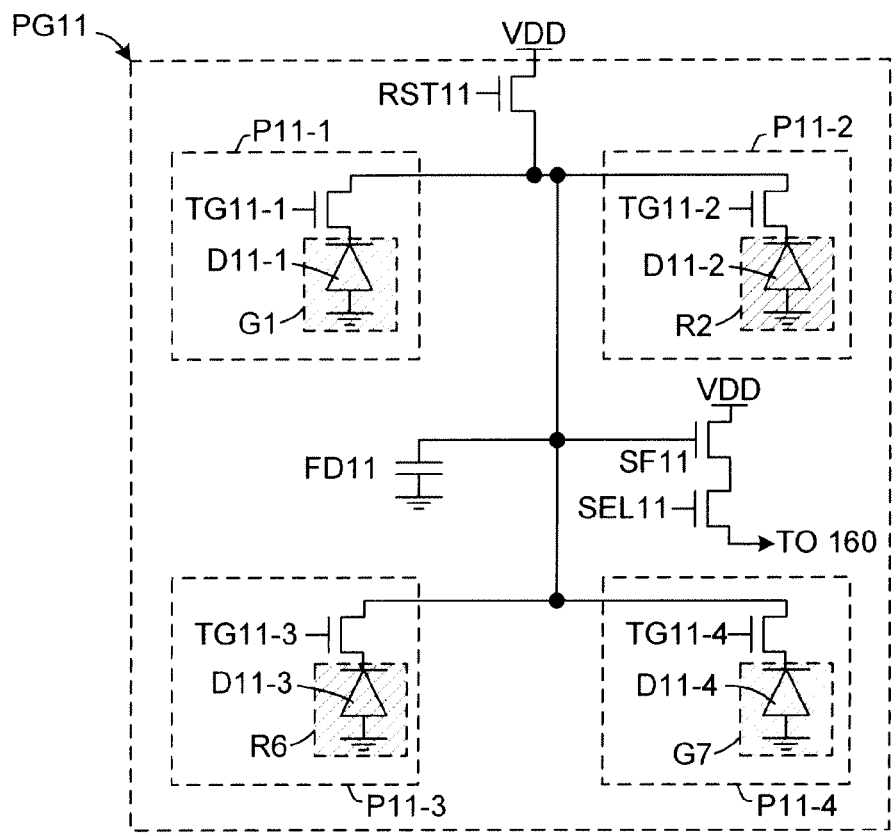
FIGS. 3(A) and 3(B) are simplified circuit diagrams showing a 2×2 shared pixel groups utilized in the image sensor of FIG. 1.
Figure 3B:
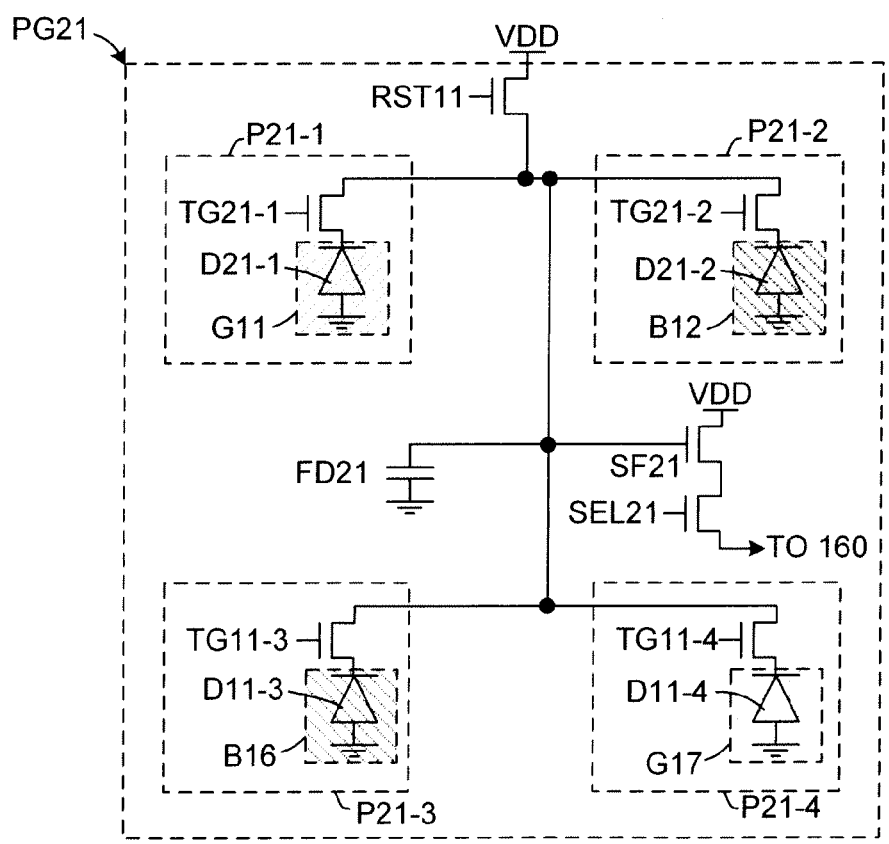

FIGS. 3(A) and 3(B) show pixel groups PG11 and PG21 in additional detail. Note that the color filters depicted in these figures are intentionally miniaturized for explanatory purposes, and that the color filter mosaic is preferably a continuous sheet as indicated in FIG. 1.

As used hereinbelow for explanatory purposes, the term "pixel" refers to a photodiode and associated transfer gate of circuit 110, and the associated color filter of mosaic 150 that is superposed over the photodiode. For example, referring to the top of FIG. 3(A), pixel 11-1 includes photodiode D11-1, transfer gate TG11-1, and green color filter G1. Thus defined, each pixel group PG11 includes four color pixels that share a common floating diffusion, reset gate source-follower circuit and select circuit. For example, as indicated in FIG. 3(A), pixel group PG11 includes pixels P11-1, P11-2, P11-3 and P11-4 respectively including photodiodes D21-1, D21-2, D21-3 and D21-4 that are respectively connected by way of transfer gates TG11-1, TG11-2, TG11-3 and TG11-4 to a node that is connected to reset transistor RST11, floating diffusion F11 and source-follower SF11, which in turn is connected to select transistor SEL1. Similarly, as indicated in FIG. 3(B), pixel group PG21 includes pixels P21-1, P21-2, P21-3 and P21-4 having photodiodes D21-1, D21-2, D21-3 and D21-4 that respectively share, by way of transfer gates TG21-1, TG21-2, TG21-3 and TG21-4, reset transistor RST21, floating diffusion F21, source-follower SF21 and select transistor SEL21.

In accordance with another aspect of the present invention, the novel color filter pattern associated with mosaic 150 in combination with the 2×2 pixel-sharing arrangement provides full resolution RGB image information, and also facilitates lower resolution RGB imaging with analog sharing of the signals from two adjacent pixels. In particular, as indicated in FIGS. 3(A) and 3(B), the novel color filter pattern provides two novel types of pixel groups: green/red pixel group PG11 (FIG. 3(A)), and green/blue pixel group PG21 (FIG. 3(B)). That is, each pixel group of image sensor 100 includes only two filter colors: green and one of red or blue. For example, pixel group PG11 includes pixels P11-1 and P11-4 that include green color filters G1 and G7, and pixels P11-2 and P11-3 that include red color filters R2 and R6. Similarly, pixel group PG21 includes pixels P21-1 and P21-4 that include green color filters G11 and G17, and pixels P21-2 and P21-3 that include blue color filters R12 and B16. With this arrangement, as described in additional detail below, full resolution imaging is performed in a manner similar to that of conventional image sensors using the 2×2 pixel sharing arrangement and Bayer Pattern color filter mosaics, but lower resolution imaging is greatly simplified by allowing the analog sharing (summing) of charges from two green, red or blue pixels in each pixel group without requiring the undesirable 4×1 sharing scheme. For example, pixel group PG11 facilitates the analog sharing of green image information generated by pixels P11-1 and P11-4 through the actuation of transfer gates TG11-1 and TG11-4, and also facilitates the analog sharing of red image information generated by pixels P11-2 and P11-3 through the actuation of transfer gates TG11-2 and TG11-3. Similarly, pixel group PG21 facilitates the analog sharing of green image information generated by pixels P21-1 and P21-4 through the actuation of transfer gates TG21-1 and TG21-4, and also facilitates the analog sharing of blue image information generated by pixels P21-2 and P21-3 through the actuation of transfer gates TG21-2 and TG21-3. As explained in additional detail below, this simplified analog sharing technique facilitates the optional generation of high (full), medium or low resolution imaging in a highly efficient manner, both in terms of space and signal quality.

Figure 4:
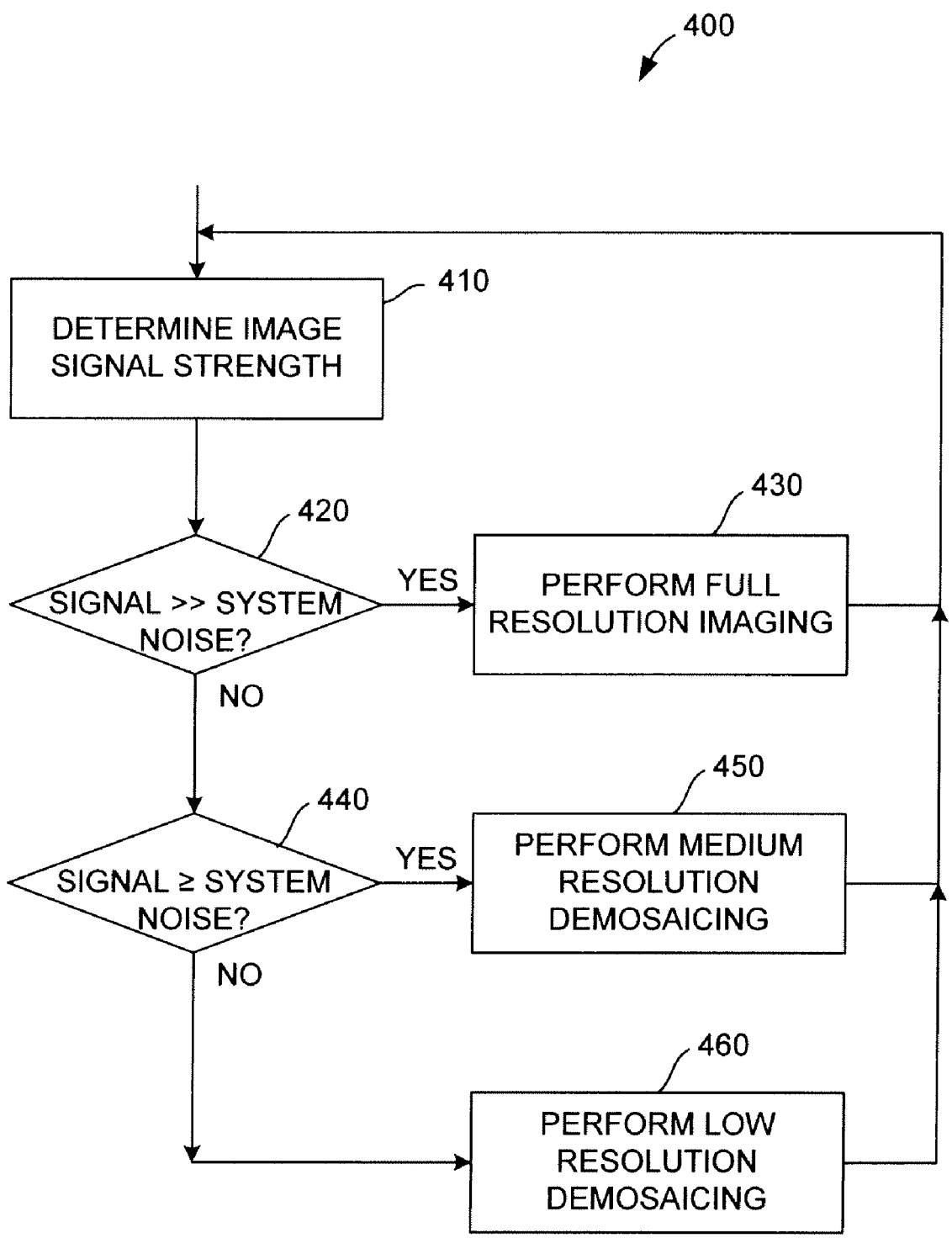
FIG. 4 is a flow diagram showing a generalized method for operating the image sensor of FIG. 1 according to an aspect of the present invention.

FIG. 4 is a flow diagram showing a generalized method for operating image sensor 100 to selectively produce high (full), medium or low resolution imaging in a highly efficient manner. The operation generally involves determining the signal level (strength) of image signals generated by the photodiodes of array 110 (block 410), and then performing one of a full resolution imaging operation (block 430) when the image SNR is above a predefined SNR of the image sensor (YES branch from block 420), or one of a medium resolution demosaicing operation (block 450) or a low resolution demosaicing operation (block 460) depending upon the image SNR relationship to the predefined SNR (e.g., as indicated in block 440, depending upon whether the image signal strength is at or below the predefined SNR).

Figure 5:
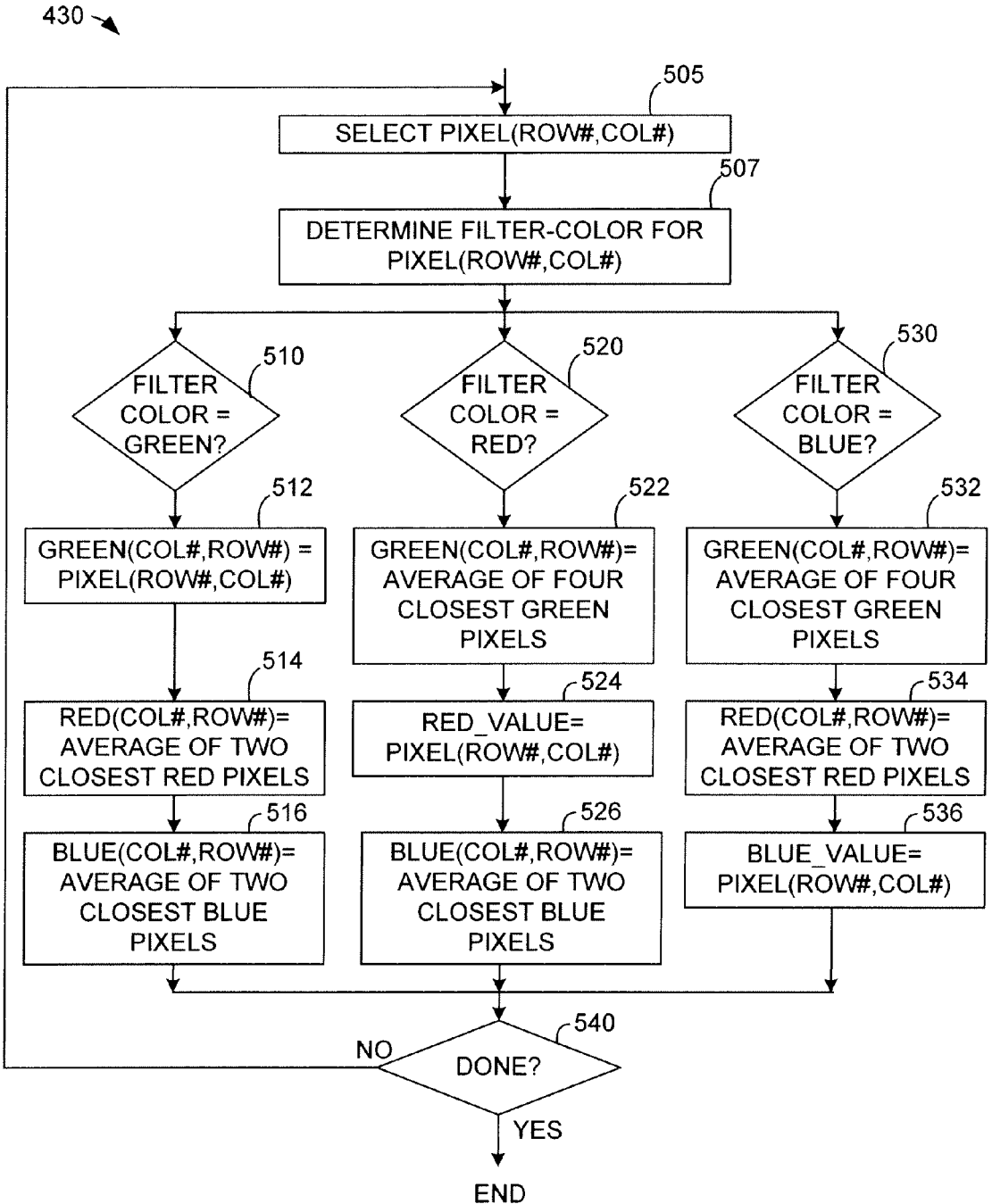
FIG. 5 is a flow diagram showing a high resolution demosaicing operation performed by the image sensor of FIG. 1 according to another aspect of the present invention.

FIG. 5 is a flow diagram showing a simplified high (full) resolution imaging operation 430 of FIG. 4 performed by image sensor 100 according to an exemplary embodiment of the present invention. The exemplary embodiment represents the simplest algorithm for full resolution imaging, and uses data from three sequential rows in order to determine discrete RGB color values for each pixel by sequentially connecting each pixel to the floating diffusion of each 2×2 pixel group (i.e., such that each of the four pixels of each pixel group are coupled by way of their respective transfer gates to the floating diffusion of the pixel group during a distinct time period). The process of FIG. 5 is performed at the pixel level, that is, for each of the four pixels of each pixel group (e.g., pixels P11-1 to P11-4 of pixel group PG11; see FIG. 3(A))). After selecting a pixel (block 505), the filter color of the selected pixel is determined (block 507), and then discrete RGB color values are generated in accordance with the color of that pixel's filter. In particular, if the pixel's filter is green, then discrete RGB values are generated according to blocks 510-516, if the pixel's filter is red, then RGB values are generated according to blocks 520-526, and if the pixel's filter is blue, then RGB values are generated according to blocks 530-536. By way of example, referring to FIG. 2, when the color filter (e.g., G7) for a selected pixel is green (block 510), the green RGB value for that pixel is the signal generated by that pixel (i.e., the signal generated by the photodiode located below filter G7; block 512 of FIG. 5), the red RGB value for that pixel is the average of the two closest red pixels (e.g., the pixels including filters R2 and R6; block 514 of FIG. 5), and the blue RGB value for that pixel is the average of the two closest blue pixels (e.g., the pixels including filters B8 and B12; block 516 of FIG. 5). When the color filter (e.g., R14) for a selected pixel is red (block 520), the green RGB value for the selected pixel is an average of the signals from the closest pixels in the three rows including filter R14 (i.e., the signals generated by the photodiodes located below filters G9, G13, G15 and G19; block 522 of FIG. 5), the red RGB value for that pixel is the R14 signal itself (block 524 of FIG. 5), and the blue RGB value for that pixel is the average of the two closest blue pixels (e.g., the pixels including filters B8 and B20; block 526 of FIG. 5). Similarly, when the color filter (e.g., B8) for a selected pixel is blue (block 530), the green RGB value for the selected pixel is an average of the closest four green pixels (e.g., the signals generated by the photodiodes located below filters G3, G7, G9 and G13; block 532 of FIG. 5), the red RGB value for pixel is the average of the two closest red pixels (e.g., the pixels including filters R2 and R14; block 534 of FIG. 5), and the blue RGB value for pixel is the B8 signal itself (block 536 of FIG. 5). Upon determining the RGB values for the selected pixel, a next pixel is selected, for example, by incrementing a column or row number according to known techniques, until all pixels have been processed (block 540).

Returning briefly to FIG. 4, medium level demosaicing (block 450) may be performed, for example, when the incident image signal strength received by the image sensor is close to the predetermined SNR value (YES branch from block 440). Medium level demosaicing generally effectively involves treating each 2×2 pixel group (e.g., pixel group PG11 of FIG. 3(A) and pixel group PG21 of FIG. 3(B)) as one "pixel". That is, RGB values for each 2×2 pixel group are generated by binning the two colors (e.g., green and blue) of each pixel group, and estimating the third color (e.g., red) by averaging third color information from two adjacent green/red pixel groups. As mentioned above and described in detail below, this binning process involves summing simultaneously connecting the green pixels of a selected pixel group to the floating diffusion of during a first time period, and simultaneously connecting the second pair of said four pixels to said floating diffusion during a second time period different from the first time period when the determined image signal strength is below the predetermined minimum signal value.

Figure 6:
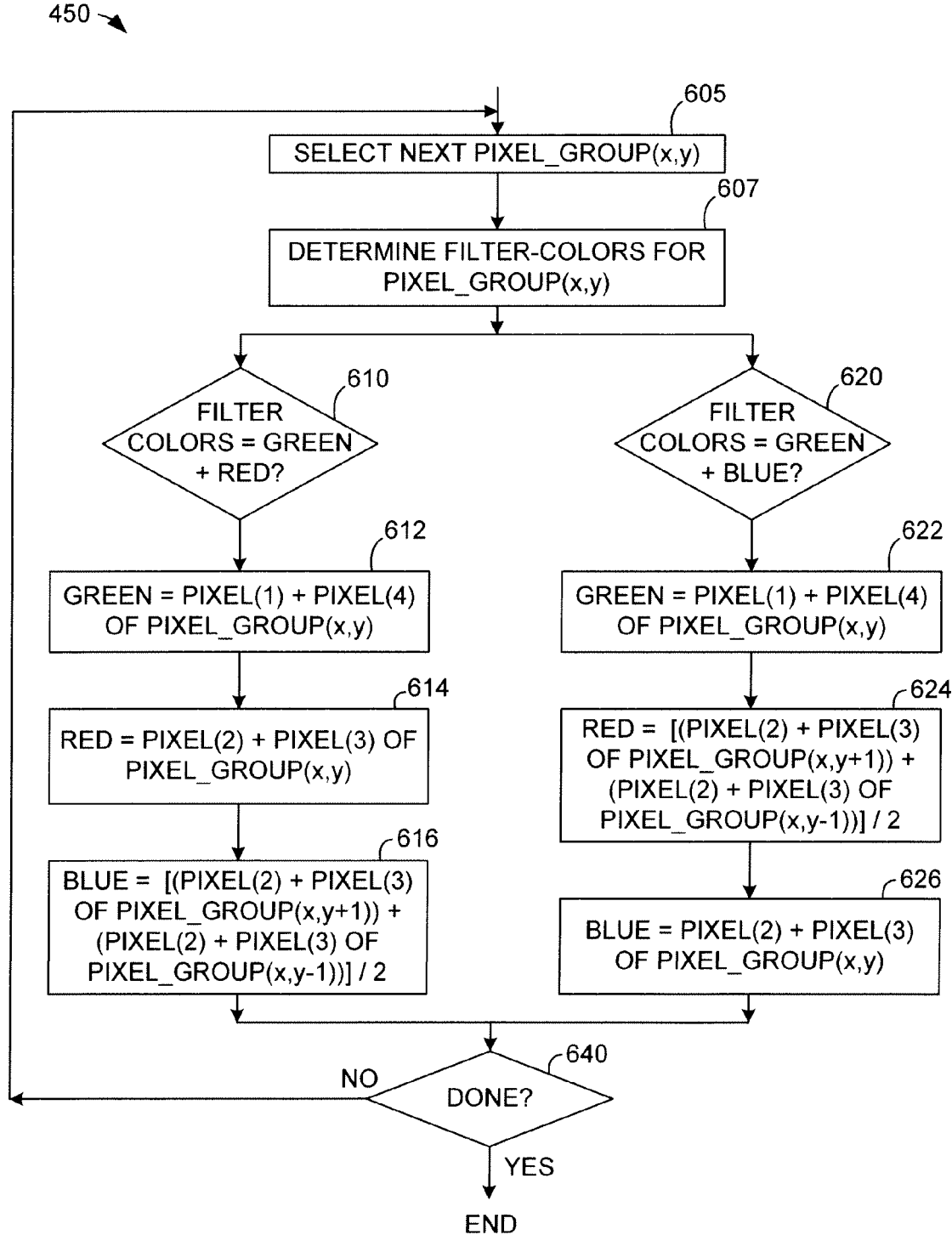
FIG. 6 is a flow diagram showing a medium resolution demosaicing operation performed by the image sensor of FIG. 1 according to another aspect of the present invention.

FIG. 6 is a flow diagram showing a medium resolution demosaicing operation performed by image sensor 100. After selecting a pixel group (block 605) and determining the two filter colors associated with the selected pixel group (block 607), pixel information for the selected pixel group is determined in accordance with that pixel group's colors. In particular, if the pixel group's filters are green and red, then summed RGB (image information) values are generated according to blocks 610-616, and if the pixel group's filters are green and red, then the summed RGB values are generated according to blocks 620-626, and if the pixel's filter is blue, then RGB values are generated by blocks 530-536. By way of example, referring to FIG. 7 and assuming the selected pixel group is PG33, when the color filters for the selected pixel is green and red (block 610), the summed green RGB value for pixel group PG33 is generated by connecting pixels P33-1 and P33-4 to floating diffusion FD33 (i.e., by turning on transfer gates TG33-1 and TG33-4; block 612 of FIG. 6) during a first time period, and the summed red RGB value for pixel group PG33 is generated by connecting pixels P33-2 and P33-3 to floating diffusion FD33 (i.e., by turning on transfer gates TG33-2 and TG33-3; block 614 of FIG. 6) during a second time period. The blue RGB value for pixel group PG33 is determined by averaging the summed RGB values of the two closest green/blue pixel groups (e.g., from pixels 32-2 and 32-3 of pixel group PG32 and pixels 34-2 and 34-3 of pixel group PG34). Similarly, when the selected pixel group includes green and blue pixels (block 620), the summed green RGB value for the selected pixel group is generated by connecting the green pixels to floating diffusion of the selected pixel group (block 622), the red RGB value is determined by averaging the summed red RGB values of the two closest green/red pixel groups (block 624), and the blue RGB value is generated by connecting the blue pixels to floating diffusion of the selected pixel group (block 626). Upon determining the RGB values for the selected pixel group, a next pixel group is selected, and the process is repeated until RGB image information is obtained for all pixel groups (YES branch from block 640).

Figure 7:
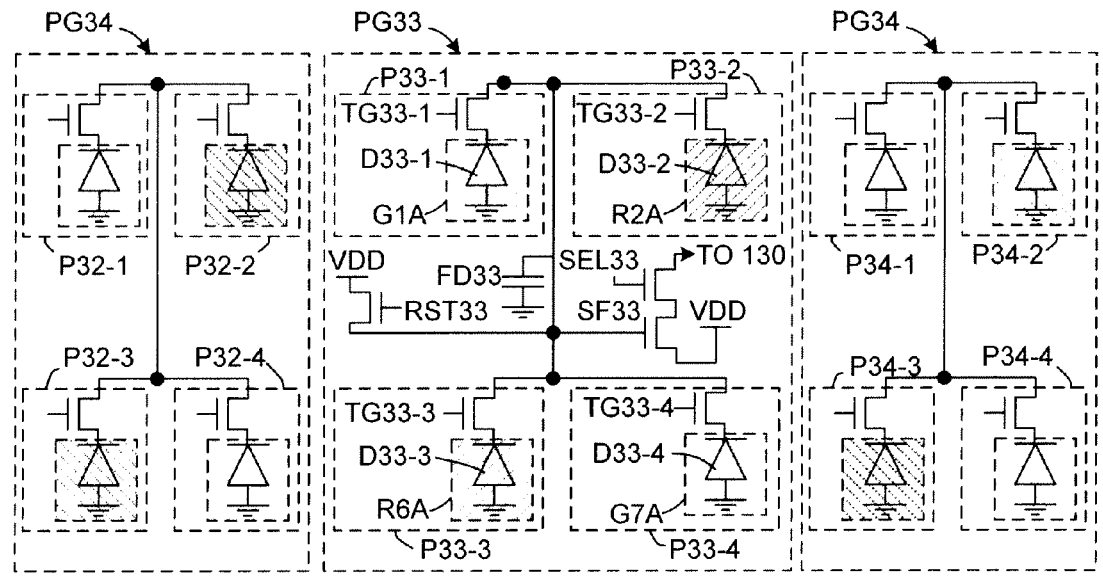
FIG. 7 is a simplified circuit diagram showing multiple 2×2 shared pixel groups that are accessed in accordance with the medium resolution demosaicing operation of FIG. 6.
Figure 8:
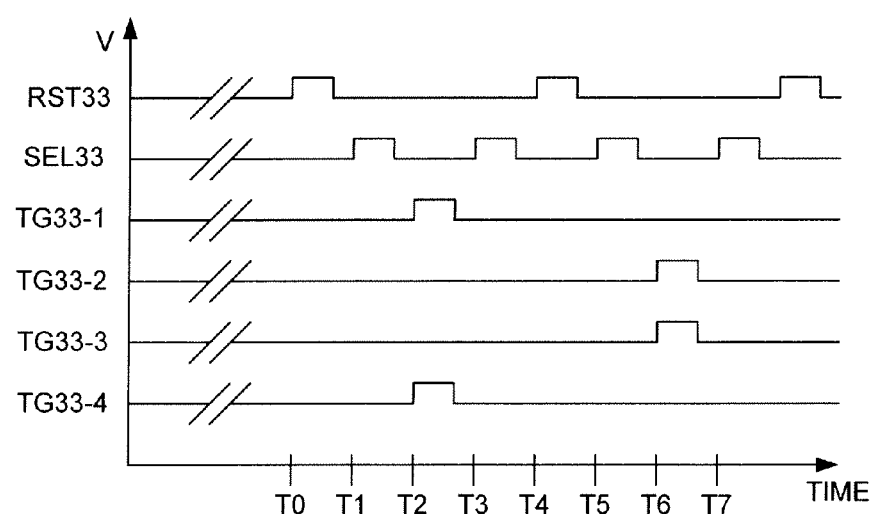
FIG. 8 is a timing diagram showing control signals transmitted to the pixel groups of FIG. 7 in accordance with the medium resolution demosaicing operation of FIG. 6.

FIG. 8 is a timing diagram showing control signals generated by sensing control circuit 160 and select circuit 165 (see FIG. 1) that are transmitted to the pixel group PG33 of FIG. 7 during an exemplary medium resolution demosaicing operation performed in accordance with the method of FIG. 6. At time T0 reset transistor RST33 is pulsed to reset floating diffusion FD33 to an initial state, and then at time T1 select transistor SEL33 is pulsed to initialize source-follower transistor SF33. Summed image information for green pixels P33-1 and P33-4 is then obtained during a (first) time period beginning at time T2 by simultaneously pulsing (turning on) transfer gates TG33-1 and TG33-3 to cause binning of the charges on photodiodes D33-1 and D33-4 at floating diffusion FD33, and then by pulsing select transistor SEL33 at time T3 to pass the resulting signal generated by source-follower SF33 in response to the captured (binned) charge generated on floating diffusion FD33 to sensing/control circuit 160 (FIG. 1). At time T4 reset transistor RST33 is again pulsed to reset floating diffusion FD33, and at time T5 select transistor SEL33 is pulsed to again initialize source-follower transistor SF33. Summed image information for red pixels P33-2 and P33-2 is then obtained during a (second) time period beginning at time T6 by simultaneously pulsing transfer gates TG33-2 and TG33-3 to cause binning of the charges on photodiodes D33-2 and D33-3 at floating diffusion FD33, and then pulsing select transistor SEL33 at time T7 to pass the resulting signal generated by source-follower SF33 to sensing/control circuit 160 (FIG. 1).

Figure 9:
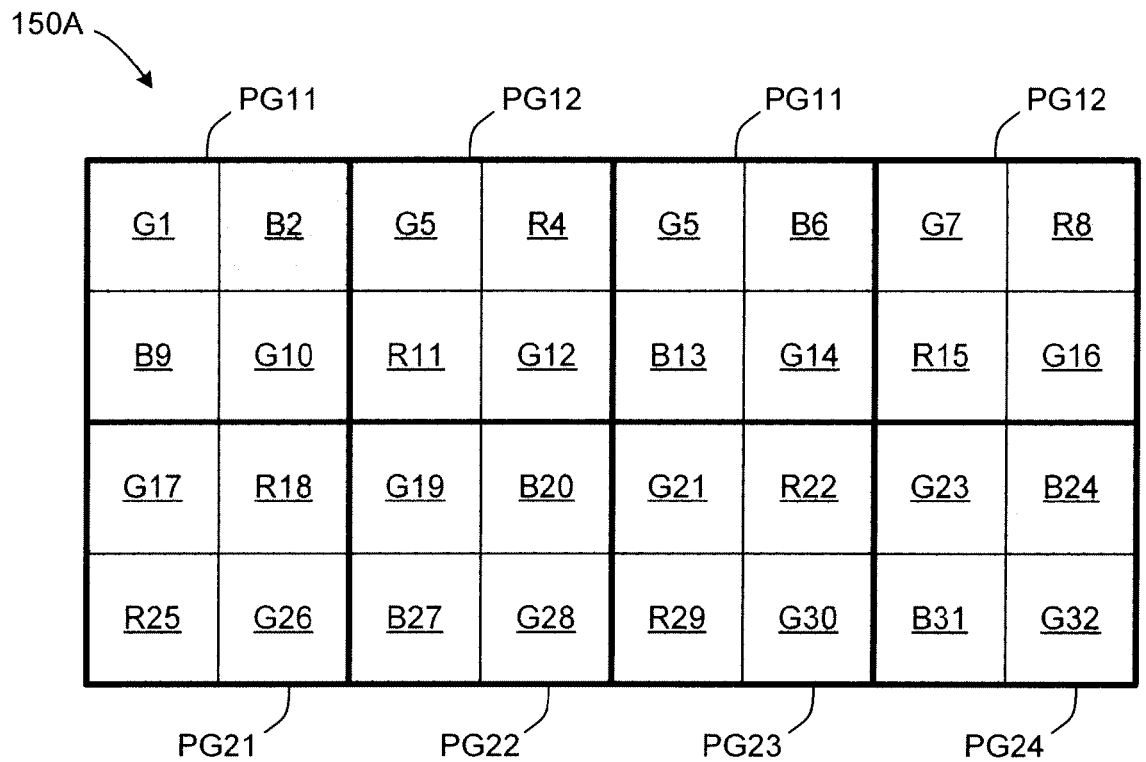
FIG. 9 is a plan view showing an 8×4 color filter mosaic in accordance with another aspect of the present invention.
Figure 10:
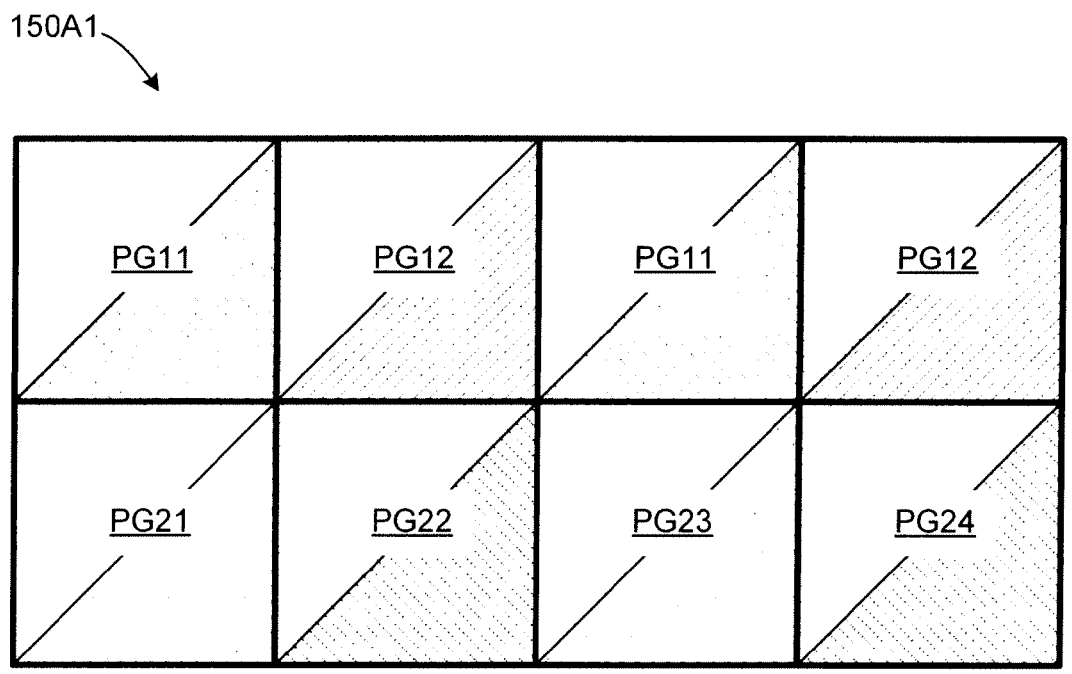
FIG. 10 is a simplified diagram showing an effective modified color filter mosaic generated in accordance with the medium resolution demosaicing operation of FIG. 6.
Figure 11:
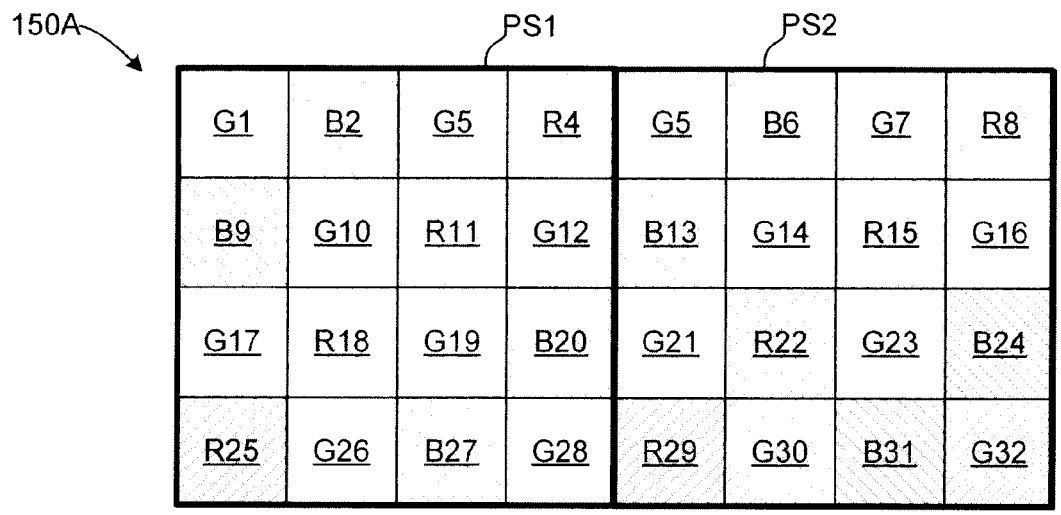
FIG. 11 is a plan view showing the 8×4 color filter mosaic of FIG. 8 divided into two pixel sets in accordance with another aspect of the present invention.

FIGS. 9 and 10 are simplified representations showing the effect of the medium level demosaicing method described above. FIG. 9 shows a color filter mosaic 150A that includes 32 color filters arranged in four rows and eight columns that collectively form eight pixel groups PG11 to PG24, wherein each pixel group includes two pairs of pixels having two color filter types. For example, pixel group PG11 includes a first pixel pair including green color filters G1 and G10, and a second pixel pair including blue color filters B2 and B9. Similarly, pixel group PG12 includes a first pixel pair including green color filters G5 and G12, and a second pixel pair including red color filters R4 and R11. As indicated in FIG. 10, the effect of medium level demosaicing is to convert each pixel group PG11 to PG24 into an effectively larger imaging "pixel" that provides summed image values for two different colors. That is, pixel group PG11 provides summed green image information having two times the magnitude (but half the resolution) of individual green pixels G1 and G10, and provides summed blue image information having two times the magnitude (but half the resolution) of individual blue pixels B2 and B9.

Figure 12:
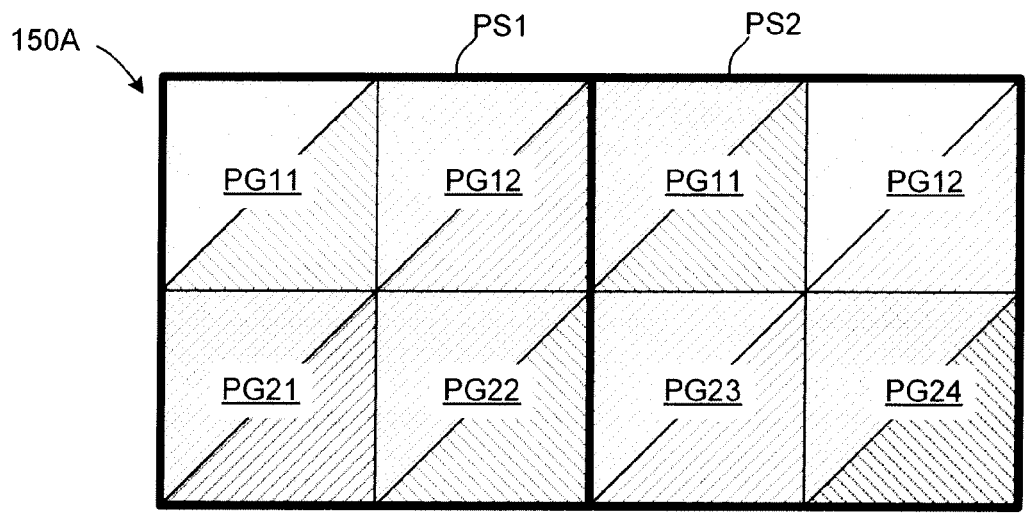
FIG. 12 is a simplified diagram showing an effective modified color filter mosaic generated in accordance with a first stage of a high resolution method for operating the image sensor of FIG. 1 according to another aspect of the present invention.
Figure 13:
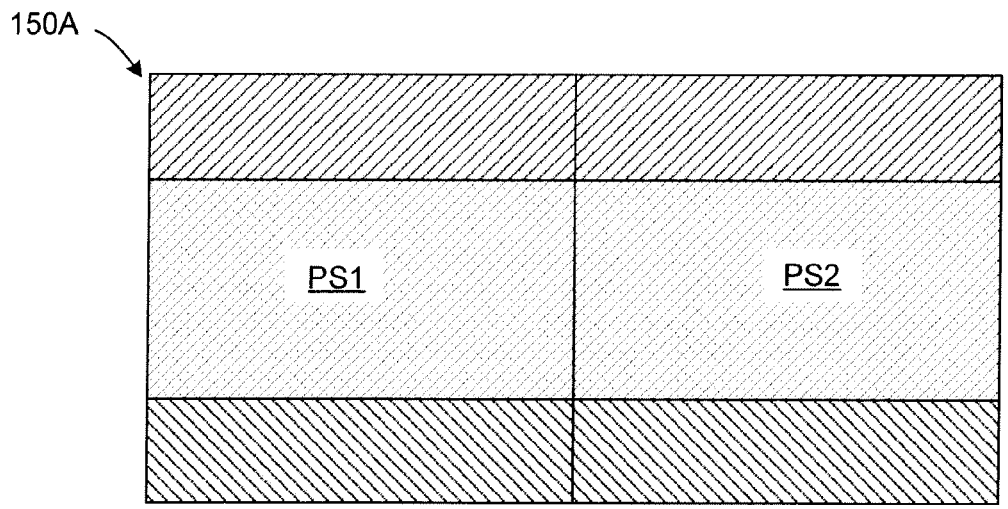
FIG. 13 is a simplified diagram showing an effective modified color filter mosaic generated in accordance with a third stage of the high resolution method.
Figure 14:
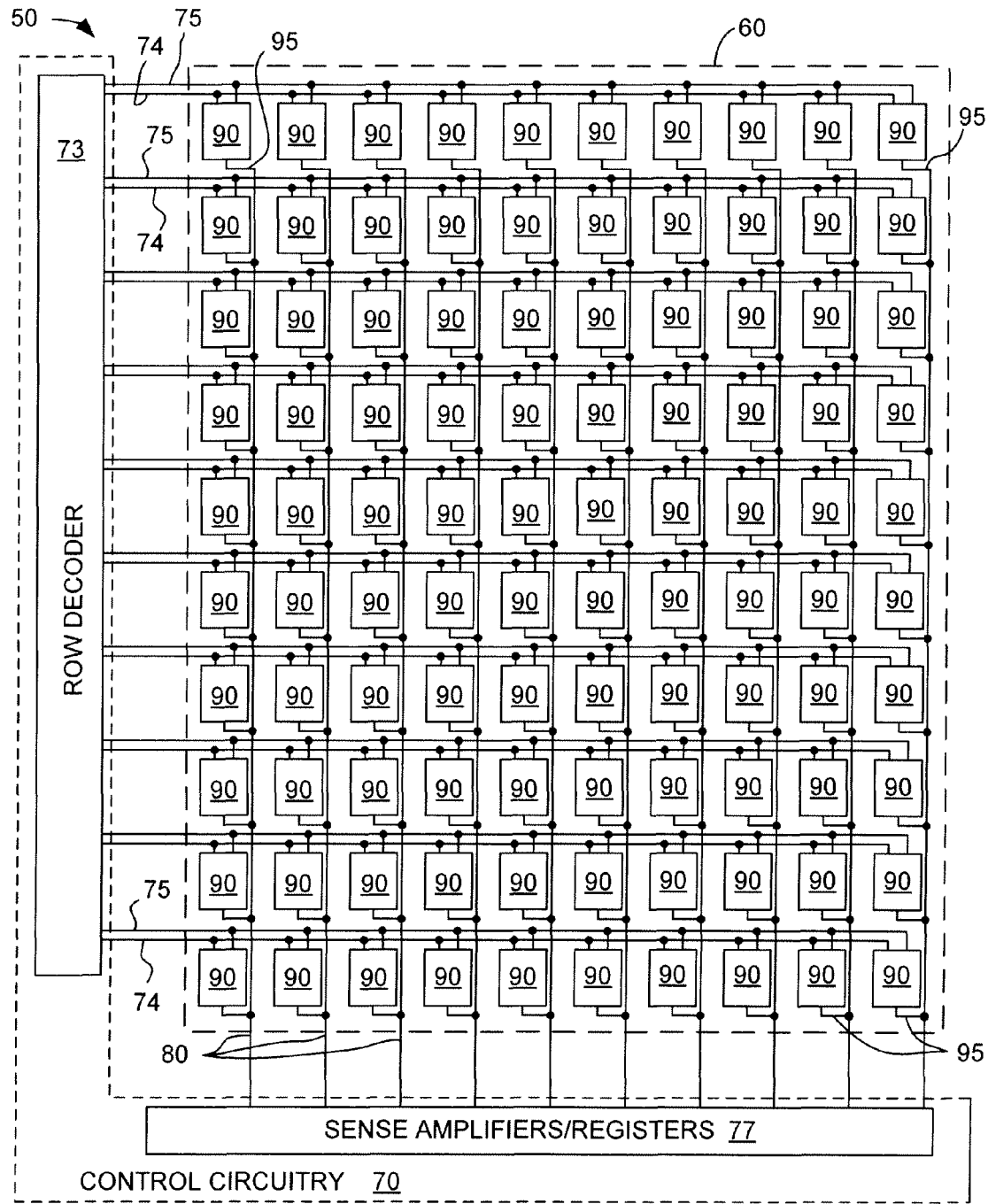
FIG. 14 is a circuit diagram showing a conventional CMOS image sensor.

Referring again to FIG. 4, in situations where the image information signal strength is very low, low resolution demosaicing is selectively performed by summing signal information obtained from a predetermined set of pixels that include more than one pixel group. For example, as indicated in FIG. 10, a pixel set PS1 associated with color filter mosaic 150A includes sixteen pixels arranged in a four-by-four pattern including filters G1-R4, B9-G12, G17-B20 and R25-G28, and a pixel set PS2 includes filters G5-R8, B13-G16, G21-B24 and R29-G32. As indicated in FIGS. 12 and 13, pixel set PS1 is effectively operated as a single large, multi-colored imaging pixel by simultaneously generating summed image information from each of its constituent pixel groups PG11, PG12, PG21 and PG22. Specifically, all green pixels associated with pixel set PS1 (e.g., G1, G5, G10, G12, G17, G19, G26 and G28) are simultaneously accessed during a first time period, and the resulting signal is summed to provide the green RGB value for pixel set P1. Similarly, all blue pixels associated with pixel set PS1 (e.g., B2, B9, B20 and B27) are simultaneously accessed during a second time period to provide the blue RGB value for pixel set P1, and all red pixels (e.g., R4, R11, R18 and R25) are simultaneously accessed during a third time period to provide the red RGB value for pixel set P1. RGB values for pixel set PS2 are generated in a similar manner. The resulting RGB values for pixel sets PS1 and PS2 are graphically represented in FIG. 13.

Although the present invention has been described with respect to certain specific embodiments, it will be clear to those skilled in the art that the inventive features of the present invention are applicable to other embodiments as well, all of which are intended to fall within the scope of the present invention. For example, although the present invention is described with specific reference to CMOS image sensors, various aspects of the present invention may be utilized in other types of color image sensors.

The invention claimed is:

1. A color image sensor comprising:
   a sensor circuit including an array of photodetectors arranged in rows and columns; and
   a color filter mosaic including individual filter elements that are superposed in one-to-one registry over said plurality of photodetectors, said mosaic being comprised of a first type of filter element having a first luminance transparency characteristic, a second type of filter element having a second transparency characteristic different from that of said first luminance transparency characteristic, and a third type of filter element having a third transparency characteristic different from that of said first and second luminance transparency characteristics,
   wherein the filter elements are arranged in repeating patterns such that:
      the first type of filter element is present over every other said photodetector in each row and column, whereby a first group of the first type of filter element forms a first diagonal line comprising only said first type of filter element, and
      the second and third types of color filters are arranged in repeating patterns such that the second and third types of filter element are present over every fourth said photodetector in each row and column, whereby a second group of said second type of filter elements forms a second diagonal line comprising only said second type of filter element, and whereby a third group of said third type of filter elements forms a third diagonal line comprising only said third type of filter element,
   wherein the sensor circuit further comprises:
      a plurality of floating diffusions, each floating diffusion being coupled to a first photodetector by a first transfer gate, a second photodetector by a second transfer gate, a third photodetector by a third transfer gate, and a fourth photodetector by a fourth transfer gate, the first, second, third and fourth photodetectors being included in said array of photodetectors with the first and second photodetectors being disposed in a first row of the array, and the third and fourth photodetectors being disposed in a second row of the array, and
      means for simultaneously transferring both a first charge present in the first photodetector and a second charge present in the fourth photodetector to said floating diffusion during a first time period, and for simultaneously transferring both a third charge present in the second photodetector and a fourth charge present in the third photodetector to said floating diffusion during a second time period.

2. The color image sensor according to claim 1, wherein the first type of color filters comprises green color filters, the second type of color filters comprises blue color filters, and the third type of color filters comprises red color filters.

3. The color image sensor according to claim 1,
   wherein the first diagonal line is disposed between the second diagonal line and the third diagonal line,
   wherein the second diagonal line is disposed between the first diagonal line and a fourth diagonal line comprising only said first type of filter element, and
   wherein the third diagonal line is disposed between the first diagonal line and a fifth diagonal line comprising only said first type of filter element.

4. The color image sensor according to claim 1, wherein the sensor circuit comprises a complementary metal-oxide-silicon (CMOS) circuit, and wherein the photodetectors comprise photodiodes.

5. The color image sensor according to claim 1,
   wherein both a first color filter superposed over the first photodetector and a second color filter superposed over the fourth photodetector comprise the first type of filter element, and
   wherein both a third color filter superposed over the second photodetector and a fourth color filter superposed over the third photodetector comprise one of the second type and the third type of filter element.

6. A color image sensor comprising:
   an array of photodetectors arranged in pixel groups on a substrate, each pixel group comprising:
      a floating diffusion; and
      first, second, third and fourth photodetectors respectively coupled to the floating diffusion by first, second, third and fourth transfer gates, wherein the first and second photodetectors are disposed in a first row of the array, the third and fourth photodetectors are disposed in a second row of the array, the first and third photodetectors disposed in a first column of the array, and the second and fourth photodetectors disposed in a second column of the array, a color filter mosaic including individual filter elements that are superposed in one-to-one registry over said array of photodetectors, said mosaic being comprised of a first type of filter element having a first luminance transparency characteristic, a second type of filter element having a second transparency characteristic different from that of said first luminance transparency characteristic, and a third type of filter element having a third transparency characteristic different from that of said first and second luminance transparency characteristics, wherein both a first color filter superposed over said first photodetector of each pixel group and a second color filter superposed over the fourth photodetector of said each group comprise the first type of filter element, and wherein both a third color filter superposed over the second photodetector and a fourth color filter superposed over the third photodetector comprise one of the second type and the third type of filter element, and means for simultaneously transferring both a first charge present in the first photodetector and a second charge present in the fourth photodetector of a selected pixel group to said floating diffusion during a first time period, and for simultaneously transferring both a third charge present in the second photodetector and a fourth charge present in the third photodetector of said selected pixel group to said floating diffusion during a second time period.

7. The color image sensor according to claim 6, wherein the first type of color filters comprises green color filters, the second type of color filters comprises blue color filters, and the third type of color filters comprises red color filters.

8. The color image sensor according to claim 6, wherein the third color filter superposed over the second photodetector and the fourth color filter superposed over the third photodetector comprise red color filters.

9. The color image sensor according to claim 6, wherein the third color filter is superposed over the second photodetector and the fourth color filter superposed over the third photodetector comprise blue color filters.

10. The color image sensor according to claim 6, wherein the sensor circuit comprises a complementary metal-oxide-silicon (CMOS) circuit, and wherein the photodetectors comprise photodiodes.

11. The color image sensor according to claim 10, wherein each pixel group further comprises:
a reset transistor coupled to said floating diffusion;
a source-follower circuit having a gate connected to the floating diffusion; and
a select transistor coupled to the source-follower circuit.

12. The image sensor according to claim 11, wherein said means for simultaneously transferring comprises:
means for actuating, during the first time period, the first and fourth transfer gates of said selected pixel group, thereby simultaneously transferring both a first charge present in the first photodetector and a second charge present in the fourth photodetector to said floating diffusion during said first time period, and
means for actuating, during the second time period, the second and third transfer gates of said selected pixel group, thereby simultaneously transferring both a third charge present in the second photodetector and a fourth charge present in the third photodetector to said floating diffusion during said second time period.

13. A color image sensor comprising:
an array of pixels arranged in a plurality of pixel groups, each pixel group including a floating diffusion and four pixels disposed in a 2×2 arrangement, each of said four pixels including a photodetector, a transfer gate connected between said photodetector and said floating diffusion, and a color filter superposed over said photodetector, wherein a first pair of said four pixels include color filters of a first type having a first luminance transparency characteristic, and a second pair of said four pixels include color filters having one of a second type and a third type, the second type having a second luminance transparency characteristic different from that of said first luminance transparency characteristic, and the third type having a third transparency characteristic different from that of said first and second luminance transparency characteristics; and
means for determining an image signal strength received by said array of pixels;
means for generating discrete image information from each of said four pixels of a selected pixel group by sequentially connecting each of said four pixels to said floating diffusion of said selected pixel group when the determined image signal strength is above a predetermined minimum signal value; and
means for generating summed image information from said four pixels of the selected pixel group by simultaneously connecting the first pair of said four pixels to said floating diffusion during a first time period, and simultaneously connecting the second pair of said four pixels to said floating diffusion during a second time period different from the first time period when the determined image signal strength is below the predetermined minimum signal value.

14. The color image sensor according to claim 13, wherein the first type of color filters comprises green color filters, the second type of color filters comprises blue color filters, and the third type of color filters comprises red color filters.

15. The color image sensor according to claim 13, wherein the first pair of said four pixels includes green color filters and the second pair of said four pixels include red color filters.

16. The color image sensor according to claim 13, wherein the first pair of said four pixels includes green color filters and the second pair of said four pixels include blue color filters.

17. The color image sensor according to claim 13, wherein each pixel group further comprises:
a reset transistor coupled to said floating diffusion;
a source-follower circuit having a gate connected to the floating diffusion; and
a select transistor coupled to the source-follower circuit.

18. The image sensor according to claim 13, further comprising means for generating summed image information from a set of said pixel groups by simultaneously connecting all pixels of said set of said pixel groups having color filters of said first type during said first time period, simultaneously connecting all pixels of said set of said pixel groups having color filters of said second type during said first time period, and simultaneously connecting all pixels of said set of said pixel groups having color filters of said third type during a third time period.

* * * * *